United States Patent [19]
Mihara et al.

[11] Patent Number: 5,466,629
[45] Date of Patent: Nov. 14, 1995

[54] PROCESS FOR FABRICATING FERROELECTRIC INTEGRATED CIRCUIT

[75] Inventors: Takashi Mihara, Iruma; Hiroyuki Yoshimori, Fujino; Hitoshi Watanabe, Tokyo, all of Japan; Larry D. McMillan; Carlos P. De Araujo, both of Colorado Springs, Colo.

[73] Assignees: Symetrix Corporation, Colorado Springs, Colo.; Olympus Optical Co., Ltd., Tokyo, Japan

[21] Appl. No.: 383,575

[22] Filed: Feb. 3, 1995

Related U.S. Application Data

[62] Division of Ser. No. 276,474, Jul. 18, 1994, which is a division of Ser. No. 919,186, Jul. 23, 1992, abandoned.

[51] Int. Cl.$^6$ .............................. H01L 21/70; H01L 27/00
[52] U.S. Cl. .............................. 437/60; 437/919; 437/947
[58] Field of Search .............................. 437/52, 948, 947, 437/60, 919; 257/295, 310; 148/DIG. 104–106; 365/145

[56] References Cited

U.S. PATENT DOCUMENTS

| | | | |
|---|---|---|---|
| 2,695,396 | 11/1954 | Anderson | 340/173 |
| 4,144,591 | 3/1979 | Brody | 365/228 |
| 4,149,301 | 4/1979 | Cook | 29/25 |
| 4,360,896 | 11/1982 | Brody | 365/145 |
| 4,649,406 | 3/1987 | Takemae et al. | 257/295 |
| 5,005,102 | 4/1991 | Larson | 361/313 |
| 5,043,049 | 8/1991 | Takenaka | 257/295 |
| 5,046,043 | 9/1991 | Miller et al. | 365/145 |
| 5,099,305 | 3/1992 | Takenaka | 357/51 |
| 5,119,154 | 6/1992 | Gnadinger | 257/295 |
| 5,122,923 | 6/1992 | Matsubara et al. | 361/321 |
| 5,170,242 | 12/1992 | Stevens et al. | 257/751 |
| 5,229,309 | 7/1993 | Kato | 257/295 |

FOREIGN PATENT DOCUMENTS

| | | |
|---|---|---|
| 415751A1 | 6/1991 | European Pat. Off. . |
| 494313A | 7/1992 | European Pat. Off. . |
| 2304796 | 12/1990 | Japan . |

OTHER PUBLICATIONS

Scott, J. F., et al., "Integrated Ferroelectrics", Condensed Matter News, pp. 16–20, 1992.

Sanchez, et al., "Process Technology Developments For GaAs Ferroelectric Nonvolatile Memory", ISIF–91, 3rd International Symposium on Integrated Ferroelectrics, Apr. 1991, pp. 524–534.

*Primary Examiner*—Olik Chaudhuri
*Assistant Examiner*—H. Jey Tsai
*Attorney, Agent, or Firm*—Duft, Graziano & Forest

[57] ABSTRACT

An oversize ferroelectric capacitor is located against the contact hole to the MOSFET source/drain in a DRAM. A barrier layer made of titanium nitride, titanium tungsten, tantalum, titanium, tungsten, molybdenum, chromium, indium tin oxide, tin dioxide, ruthenium oxide, silicon, silicide, or polycide lies between the ferroelectric layer and the source drain. The barrier layer may act as the bottom electrode of the ferroelectric capacitor, or a separate bottom electrode made of platinum may be used. In another embodiment in which the barrier layer forms the bottom electrode, an oxide layer less than 5 nm thick is located between the barrier layer and the ferroelectric layer and the barrier layer is made of silicon, silicide, or polycide. A thin silicide layer forms and ohmic contact between the barrier layer and the source/drain. The capacitor and the barrier layer are patterned in a single mask step. The ends of the capacitor are stepped or tapered. In another embodiment both the bottom and top electrode may be made of silicon, silicide, polycide or a conductive oxide, such as indium tin oxide, tin dioxide, or ruthenium oxide.

6 Claims, 7 Drawing Sheets

PROCESS FOR FABRICATING FERROELECTRIC INTEGRATED CIRCUIT

RELATED APPLICATIONS

This application is a divisional of Ser. No. 08/276,474 filed Jul. 18, 1994, which is a divisional of application Ser. No. 07/919,186 filed Jul. 23, 1992, now abandoned.

BACKGROUND OF THE INVENTION

1. Field of the Invention.

The invention in general relates to the structure and fabrication of integrated circuits and more particularly to an integrated circuit including ferroelectric components, and a process for fabrication of integrated circuits containing ferroelectric components.

2. Statement of the Problem

As is well-known, integrated circuits, sometimes called semiconductor devices, are generally mass produced by fabricating hundreds of identical circuit patterns on a single semiconducting wafer, which wafer is subsequently sawed into hundreds of identical dies or chips. While integrated circuits are commonly referred to as "semiconductor devices" they are in fact fabricated from various materials which are either electrically conductive, electrically nonconductive, or electrically semiconductive. This invention relates to a semiconductor devices utilizing ferroelectric materials. The invention shall be described as implemented with lead zirconate titanate (PZT), a ferroelectric material of the Perovskite structure and which is most commonly used in ferroelectric integrated circuits; however, it may also be implemented utilizing other ferroelectric materials, such as those described in U.S. patent application Ser. No. 807,439, now abandoned.

The semiconducting material out of which the wafer and other parts of integrated circuits are fabricated is generally either silicon (Si) or gallium arsenide (GaAs). Since silicon is the most commonly used material, the invention shall be described in terms of silicon technology, although the invention is also applicable to semiconductor technologies based on GaAs or other semiconductors. Silicon can be used in either the single crystal or polycrystalline form in integrated circuits. In the integrated circuit fabrication art, polycrystalline silicon is usually called "polysilicon" or simply "poly", and shall be referred to as such herein. Both forms of silicon may be made conductive by adding impurities to it, which is commonly referred to as "doping". If the doping is with an element such as boron which has one less valence electron than silicon, electron "holes" become the dominant charge carrier and the doped silicon is referred to as p-type silicon. If the doping is with an element such as phosphorus which has one more valence electron than silicon, additional electrons become the dominant charge carriers and the doped silicon is referred to as n-type silicon. Silicon dioxide is commonly used as an insulator in silicon-based semiconductors devices. Its use is so universal that in the integrated circuit art it is often referred to as simply as "oxide". Another common silicon-based structure is called polycide. This is a composite, layered material comprising a layer of metal silicide and a layer of polysilicon. CMOS (Complimentary Metal Oxide Semiconductor) technology is currently the most commonly used integrated circuit technology, and thus the present invention will be described in terms of silicon-based CMOS technology, although it is evident that it may be utilized in other integrated circuit technologies.

The invention shall also be implemented in one of the most common, simple, and most dense integrated circuit devices, the DRAM (Dynamic Random Access Memory). DRAM circuits comprise arrays of memory cells, each cell comprising two main components: a field effect transistor (FET) and a capacitor. In the most common circuit designs, one side of the transistor is connected to one side of the capacitor, the other side of the transistor and the transistor gate are connected to external connection lines called the bit line and word line, respectively. The other side of the capacitor is connected to a reference voltage. Information is stored in the individual cell by placing a voltage across the capacitor which causes it to store a charge. The transistor provides a switch to access the capacitor. Thus the fabrication of the DRAM cell essentially comprises the fabrication of a transistor, a capacitor, and three contacts to external circuits.

A term that is often used in the art of fabrication of integrated circuits, and particularly DRAMs, is "active area" (A.A.). An active area is an area in a integrated circuit to which electrical connection is to be made. A common intermediate structure during the fabrication process of conventional DRAMs, is one in which one or more source/drain active area regions of a FET are exposed via holes in the wafer surface, while the areas adjacent the active areas are covered with silicon dioxide or other insulator. The DRAM capacitors are conventionally formed in these regions by laying down the bottom capacitor electrode layer, the capacitor dielectric layer, and the top capacitor electrode layer, while shaping the layers with a series of etch and/or mask processes to form a convoluted capacitor structure that has a large area. The final dimensions of the capacitor are then defined in one or more mask steps. The resulting capacitor overlies the area around the active area hole and the electrical connection to the bottom electrode is made through the hole to the active area. Such capacitor structures are sometimes called oversize capacitors against contact holes.

It has been known for many years that ferroelectric materials potentially offer significant advantages in integrated circuits, particularly integrated circuit memories. For example, the lowest cost, highest capacity integrated circuit memories, including conventional DRAMs, are volatile memories, that is, information stored in the memories remains only so long as power is applied to the integrated circuit. Currently available non-volatile memories, such as EPROMS or flash-type memories, are relatively costly, have relatively low storage density, require extremely high voltage applied for long periods to write and erase data, and generally have a more limited erase and write lifetime than DRAMs. It has long been recognized that ferroelectric materials have polarization states that can be selected or switched by application of an electric field, and that these polarization states remain after the electric field is removed. It is well-known that if a ferroelectric capacitor is substituted for the conventional silicon dioxide dielectric capacitor in the DRAM, instead of simply storing a charge that leaks off quickly, the capacitor can be switched between selected polarization states that will remain indefinitely after power is removed. Thus ferroelectric materials offer the possibility of simple, low cost, high density, non-volatile memories. Further, many semiconductor materials and devices, and in particular the low cost, high, capacity memories such as conventional DRAMs, are susceptible to damage or alteration of their states from radiation. It is well-known that ferroelectric materials are highly resistant to radiation damage and that their ferroelectric states are highly resistant to being altered by radiation. In addition ferroelectric memories do not need high voltage for writing or erasing, and can be written to or erased as fast as conventional memories can be read. Thus, considerable research and development has been directed toward the design and manufacture of an integrated circuit memory utilizing the switchable property of ferroelectric materials. Such memories are described in U.S. Pat. No. 2,695,396 issued to Anderson, U.S. Pat. No. 4,144,591 issued to Brody, U.S. Pat. No. 4,149,301 issued to Cook, and U.S. Pat. No. 4,360,896 issued to Brody. However, for many years no commercially successful integrated circuit memory utilizing ferroelectric switching was produced because the ferroelectric materials tended to be incompatible with the semiconductor materials and structures used in integrated circuits. When the ferroelectric materials were combined with the conventional materials in conventional integrated circuit structures, they either damaged the semiconductor materials or their ferroelectric properties were altered. Further, the ferroelectric materials memories tended to be unreliable due to fatigue of the ferroelectric material under repetitive switching, and retention of the polarization state.

Recently, more practical integrated circuits utilizing ferroelectric materials have been designed. U.S. Pat. No. 5,046,043 issued to Miller et al. discloses a DRAM memory utilizing a ferroelectric switching capacitor. In one embodiment Miller et al. solve the problem of incompatibility between ferroelectrics and the materials and structures of the silicon-based integrated circuit technology by isolating the ferroelectric capacitor from the silicon materials with a thick layer of silicon dioxide ($SiO_2$) plus a silicon nitride barrier layer, plus an isolation layer of titanium dioxide ($TiO_2$). In a second embodiment, the ferroelectric capacitor is separated from the sensitive MOSFET gates with thick layers of silicon dioxide and phosphorus glass and from the doped silicon active areas with a thick layer of titanium tungsten (TiW). In a third embodiment, the ferroelectric capacitor is separated from the sensitive MOSFET gates with the silicon nitride barrier and titanium dioxide isolation layers while separating the ferroelectric capacitor from the doped silicon active areas with a layer of metal, such as titanium or titanium nitride. While this disclosure solves some of the prior problems, the resulting integrated circuits and fabrication methods remain relatively complex. In the first embodiment the ferroelectric capacitors are well removed from the MOS structures, resulting in relatively low densities, and six photo-mask steps are required to form the ferroelectric capacitor; in the second embodiment the number of photo-mask steps is reduced to two, but the ferroelectric capacitors remain well removed from the MOS structures; in the third embodiment the structure is more compact, but at least seven photo-mask steps are required to form the ferroelectric capacitor. As is well-known, a photo-mask step is a relatively complex and expensive process comprising creating a photolithographic mask containing the pattern of the parts to be fabricated, coating the integrated circuit wafer with a light-sensitive material called photoresist or resist, exposing the resist-coated wafer to ultraviolet light through the mask to soften or harden parts of the resist depending on whether positive or negative resist is used, removing the softened parts of the resist, etching the wafer to remove the part unprotected by the resist, and stripping the remaining resist. As a result the ferroelectric integrated circuits produced according to the Miller et al. disclosure remain relatively high cost specialty items.

The advantages of building integrated circuits compactly so that more circuitry may be packed on a single chip are well-known: electronic equipment becomes less bulky, reliability is improved by reducing the number of solder or plug connections, assembly and packaging costs are minimized, and improved circuit performance, in particular higher clock speeds, is obtained. In addition, the business of fabricating semiconductor devices is a competitive, high-volume business. Thus manufacturing efficiency is highly important. Product quality and reliability are also highly important. It is well-known in the art that reducing the number of mask steps in the integrated circuit manufacturing process not only reduces manufacturing costs and time but also generally increases the quality and reliability of the end product, since the opportunities for disabling defects to occur are reduced. This in turn feeds back into further reduced manufacturing costs since scrapped product is reduced. Thus, a ferroelectric integrated circuit structure and process that not only permits more compact devices but also reduces the number of fabrication steps, particularly the number of mask steps, would be a significant advance in the art.

Japanese Patent No. 2-304796 discloses a more compact structure using fewer mask steps. According to this disclosure, a ferroelectric capacitor is deposited directly on the source/drain active area region of the MOS transistor. The bottom conductive layer in contact with the active area is platinum silicide (PtSi) or other metal silicide. The ferroelectric layer is deposited on the bottom electrode, then, to separate the ferroelectric material from the MOS transistor, the ferroelectric material is etched back so that it covers only the contact area. This process does not provide a reliable ferroelectric capacitor since the ferroelectric properties are diminished by interdiffusion and alloying with the PtSi or other metal silicide and the capacitor is limited to the size of the source/drain area which is very small.

The article "Integrated Ferroelectrics" by J. F. Scott, C. A. Paz De Araujo, and L. D. McMillian in *Condensed Matter News*, Vol. 1, No. 3, 1992, pp. 16–20, provides an overview of the current state of the art in ferroelectric integrated circuits. It lists at least 16 current developmental programs in integrated ferroelectric devices. None of these programs have yet provided a high-density, simple, easily fabricated device. Thus there remains a need for a ferroelectric integrated circuit structure and fabrication method that results in reliable, low cost, high density integrated circuit devices.

In addition to the switched capacitor structure described above, the "Integrated Ferroelectrics" article lists true ferroelectric field effect transistors, high capacity dynamic random access memories, CCD multiplexer read-out systems, integrated pyroelectric detectors, integrated surface acoustic wave devices, spatial light monitors, and microwave devices as devices that now exist in which ferroelectrics are fully integrated into Si or GaAs chips. Thus, it is evident that the disclosure of apparatus and methods for more easily fabricating a reliable, high density, ferroelectric switched capacitor DRAM implemented in silicon technology should have applications across a wide range of ferroelectric devices.

Solution to the Problem

The present invention provides a barrier layer that permits the fabrication of compact, reliable integrated circuit structures.

The barrier layer preferably comprises one or more of the following materials: titanium nitride (TiN), titanium tungsten (TiW), tantalum (Ta), titanium (Ti), tungsten (W), molybdenum (Mo) or chromium (Cr). However, the process permits the use of other materials which prevent interdiffusion between the ferroelectric components and the conventional integrated circuit components.

A key aspect of the solution to the problem has been the discovery or recognition that a ferroelectric capacitor on silicon dioxide or other insulator has good ferroelectric properties.

The invention provides an oversized capacitor against an active area contact hole. The invention provides a ferroelectric capacitor overlaid on a conducting barrier layer over the active area and adjacent regions. It has been found that while the ferroelectric properties of the ferroelectric capacitor in the contact region remain poor, the ferroelectric properties of the capacitor in the adjacent insulator-covered regions are good. Thus, the discovery permits the formation of ferroelectric capacitors of in essentially the same location as conventional capacitors in DRAMs. As a result, reliable ferroelectric DRAMS with essentially the same density as conventional DRAMs become possible.

An thin layer of contact material may be formed over the contact area prior to laying down the barrier layer to improve the ohmicity of the contact between the barrier layer and the active area.

The invention also provides a simple fabrication method to obtain the above structure. According to the method of the invention, the barrier layer, the capacitor bottom electrode layer, the ferroelectric layer, and the capacitor top electrode are laid down in subsequent layers on the conventional silicon wafer with exposed active areas. Then a single mask step is used to define the capacitor and barrier layer. Thus the fabrication process of the invention is one of relatively low cost.

In several embodiments the barrier layer itself is used as the bottom electrode. This further simplifies the fabrication method.

It has also been discovered that if a silicon-based material, such as polysilicon, a silicide, or polycide is used as a bottom electrode, a top electrode, or both, then good ferroelectric properties result. The silicon-based material can be applied directly to the active area. Thus a silicon-based material can also act as a barrier layer. In some cases, in the process of annealing the ferroelectric material a thin silicon dioxide or other insulative layer is formed between the electrode and the ferroelectric material. Preferably, the insulative layer should be 5 nm or less to prevent the formation of a parasitic capacitor.

In addition it has been discovered that good ferroelectric properties result in a structure comprising a bottom electrode, a top electrode, or both top and bottom electrodes made of a conductive oxide such as indium tin oxide (InSnO), tin dioxide ($SnO_2$), ruthenium oxide ($Ru_2O_3$) and others. The conductive oxide may be applied directly to the active area. It is believed that the oxygen ions in the conductive oxide compensate for an oxygen deficiency region at the ferroelectric interface such that the Fermi-level of the bottom electrode remains inside the interface layer. This results in the charge compensation occurring almost entirely outside of the electrode. Thus these conductive oxide materials also can act as a barrier layer.

The invention also provides a method of preventing shorts between the top and bottom electrodes of the ferroelectric capacitor that may be used with any of the above structures. In one aspect of the method an extra mask process is used to create a step at the edge of the capacitor so that the top electrode is narrower that the bottom electrode. In another aspect of the method a tapered edge is formed.

The present invention is particularly applicable to DRAM in that it provides a process for efficiently forming a capacitor of large area. However, once the methods of providing a transition between the conventional integrated circuit materials and the ferroelectric materials and the other features are understood as they are implemented in DRAMs, it is evident that it can be applied in other circuits also.

SUMMARY OF THE INVENTION

The invention provides a ferroelectric integrated circuit comprising: a semiconducting substrate; a transistor formed on the substrate, the transistor including a transistor gate; an insulating layer overlying the transistor gate; a contact hole passing through the insulating layer to the substrate; a conducting barrier layer overlying at least a portion of the insulating layer and at least a portion of the transistor gate and in electrical contact with the substrate through the contact hole; and a ferroelectric device, the ferroelectric device including a ferroelectric layer overlying at least a portion of the conducting barrier layer and at least a portion of the transistor gate. Preferably, the barrier layer comprises a material from the group comprising: titanium nitride, titanium tungsten, tantalum, titanium, tungsten, molybdenum, chromium, indium tin oxide, tin dioxide, ruthenium oxide, silicon, silicide, and polycide. Preferably, the ferroelectric device comprises a ferroelectric capacitor and the barrier layer comprises the bottom electrode of the ferroelectric capacitor. In another embodiment the integrated circuit further includes an oxide layer less than 5 nm thick located between the barrier layer and the ferroelectric layer, and the barrier layer comprises a material from the group comprising: silicon, silicide, and polycide. Preferably, in the above embodiments the ferroelectric device comprises a ferroelectric capacitor comprising: a capacitor bottom electrode; the ferroelectric layer formed on the bottom electrode; and a capacitor top electrode formed on the ferroelectric layer. Preferably, the distance between the end of the capacitor bottom electrode and the end of the capacitor top electrode is longer than the thickness of the ferroelectric layer perpendicular to the electrodes. Preferably, a step is formed in the outer edge of the ferroelectric layer. Alternatively, the outer edge of the capacitor is tapered.

In another aspect the invention provides a ferroelectric integrated circuit comprising: a semiconducting substrate; a transistor formed on the substrate, the transistor including a gate and a source/drain adjacent the gate; an insulating layer overlying the transistor gate and at least a portion of the substrate; a ferroelectric capacitor, the ferroelectric capacitor including a bottom electrode, a ferroelectric layer, and a top electrode; and the bottom electrode of the ferroelectric capacitor electrically contacting the source/drain and the ferroelectric capacitor overlying an area of the insulating layer at least twice the area of the source drain. Preferably, the bottom electrode comprises a material from the group comprising: titanium nitride, titanium tungsten, tantalum, titanium, tungsten, molybdenum, chromium, ITO, tin dioxide, ruthenium oxide silicon, silicide, and polycide. In another embodiment the integrated circuit further includes an oxide layer less than 5 nm thick located between the barrier layer and the ferroelectric layer, and the barrier layer comprises a material from the group comprising: silicon, silicide, and polycide.

In a further aspect, the invention provides a ferroelectric integrated circuit comprising: a semiconducting substrate; a transistor formed on the substrate, the transistor including a gate and a source/drain adjacent the gate; an insulating layer overlying the transistor gate and at least a portion of the substrate; a ferroelectric capacitor, the ferroelectric capacitor including a bottom electrode, a ferroelectric layer, and a top electrode; and a first portion of the bottom electrode of the ferroelectric capacitor overlying at least a portion of the insulating layer and a second portion of the bottom electrode being essentially in physical contact with the source/drain. Preferably, the bottom electrode comprises a material from the group comprising: titanium nitride, titanium tungsten, tantalum, titanium, tungsten, molybdenum, chromium, ITO, tin dioxide, ruthenium oxide, silicon, silicide, and polycide. In another embodiment the integrated circuit further includes an oxide layer less than 5 nm thick located between the barrier layer and the ferroelectric layer, and the barrier layer comprises a material from the group comprising: silicon, silicide, and polycide.

The invention also provides a method of fabricating a ferroelectric integrated circuit, the method comprising the steps of: providing a semiconducting wafer including: a semiconducting substrate; a transistor formed on the substrate, the transistor including a gate; an insulating layer overlying the transistor gate and at least a portion of the substrate; and an exposed active area on the substrate; forming a conductive layer on the wafer, a first portion of the barrier layer essentially in physical contact with the active area and a second portion overlying the insulating layer; forming a ferroelectric layer in electrical contact with the conductive layer; forming a capacitor top electrode overlying the ferroelectric layer; and patterning the conductive layer, the ferroelectric layer, and the top electrode in a single photo-mask and etch step. Preferably, the conductive layer is a conductive barrier layer and further including the step of forming a bottom capacitor electrode between the steps of forming a conductive barrier layer and forming a ferroelectric layer, and wherein the step of patterning further comprises patterning the bottom capacitor electrode in the same photo-mask and etch step in which the conductive barrier layer, the ferroelectric layer, and the top electrode are patterned. Preferably, the method further comprises the step of patterning the ends of the top electrode and the ferroelectric layer to decrease the possibility of short circuits between the top electrode and the conductive layer. Preferably, the step of patterning the ends comprises the steps of patterning the top electrode with a first photo-mask and patterning at least a portion of ferroelectric layer and the conductive layer with a second photo mask which has a larger area than the first photo-mask. Alternatively, the step of patterning the ends comprises creating a gradual taper from the top electrode, across the thickness of the ferroelectric layer to the conductive layer. Preferably, the step of patterning comprises using a photo-mask that is at least twice the area of the active area.

In another aspect the invention provides a method of fabricating an integrated circuit comprising: providing a semiconducting wafer including a semiconducting substrate; forming transistors on the substrate each transistor including a source/drain; forming an insulating layer over the transistors and the substrate; opening holes through the insulating layer to the source/drains to create first active areas; forming an ohmic contact member on each of the active areas using a self-aligned contact process, the ohmic contact member comprising a conductive silicide; depositing a barrier layer over the whole wafer; forming a ferroelectric capacitor on the barrier layer; and patterning the barrier layer and the ferroelectric capacitor. Preferably, the step of patterning comprises patterning the barrier layer and the capacitor in a single photo-mask and etch process. Preferably, the ohmic contact member comprises a material from the group comprising PtSi, MoSi, and PbSi and the barrier layer comprises a material from the group comprising: titanium nitride, titanium tungsten, tantalum, titanium, tungsten, molybdenum, chromium, indium tin oxide, tin dioxide, and ruthenium oxide.

In a further aspect the invention provides a method of fabricating an integrated circuit comprising: providing a semiconducting wafer including a semiconducting substrate; forming a bottom capacitor electrode, a ferroelectric layer, and a top capacitor electrode without intervening photo-mask steps; patterning the ends of the bottom capacitor electrode, the ferroelectric layer, and the bottom capacitor electrode so that the distance between the ends of the bottom capacitor electrode and the top capacitor electrode is longer than the thickness of the ferroelectric layer perpendicular to the electrodes. Preferably, the step of patterning comprises the steps of: patterning the top capacitor electrode in a first photo mask step using a first photo-mask; and patterning at least a portion of the ferroelectric layer and the bottom capacitor electrode in a second photo-mask step using a second photo-mask having a larger area than the first photo-mask. Alternatively, the step of patterning the ends comprises creating a gradual taper from the top electrode, across the thickness of the ferroelectric layer to the bottom electrode. Preferably, the taper makes an angle of between 30 degrees and 70 degrees with the perpendicular between the electrodes.

The invention not only provides structures and methods for making a dense, relatively simple ferroelectric DRAM, but it also provides an integrated circuit structure which provides good ferroelectric properties. Numerous other features, objects and advantages of the invention will become apparent from the following description when read in conjunction with the accompanying drawings.

DESCRIPTION OF THE PREFERRED EMBODIMENT

Overview

Figure 1:
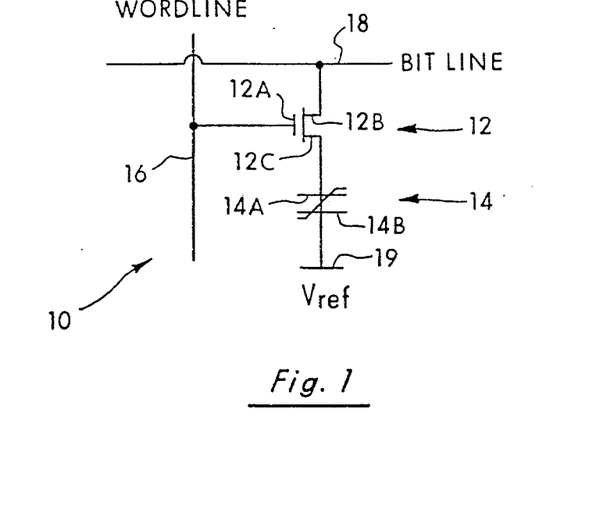
FIG. 1 shows a circuit diagram of a ferroelectric DRAM cell.

Turning now to FIG. 1, a circuit diagram for a ferroelectric DRAM cell 10 is shown. The cell 10 includes a transistor 12 and a ferroelectric switching capacitor 14. The gate 12A of the transistor 12 is connected to the word line 16, one source/drain 12B is connected to the bit line 18, while the other source/drain 12C is connected to the "bottom" electrode 14A of the capacitor 14. The "top" electrode 14B of the capacitor 14 is connected to a reference voltage source 19 commonly referred to as the "plate line" or simply "plate" in integrated circuits.

Figure 7:
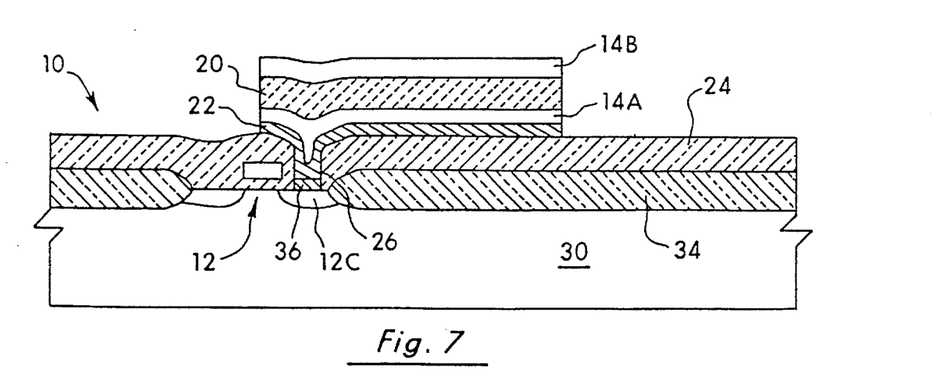
FIG. 7 is a cross-sectional view of the portion of the DRAM wafer of FIG. 6 after a photo-mask and etch process to pattern the ferroelectric capacitor and barrier layer.
Figure 9:
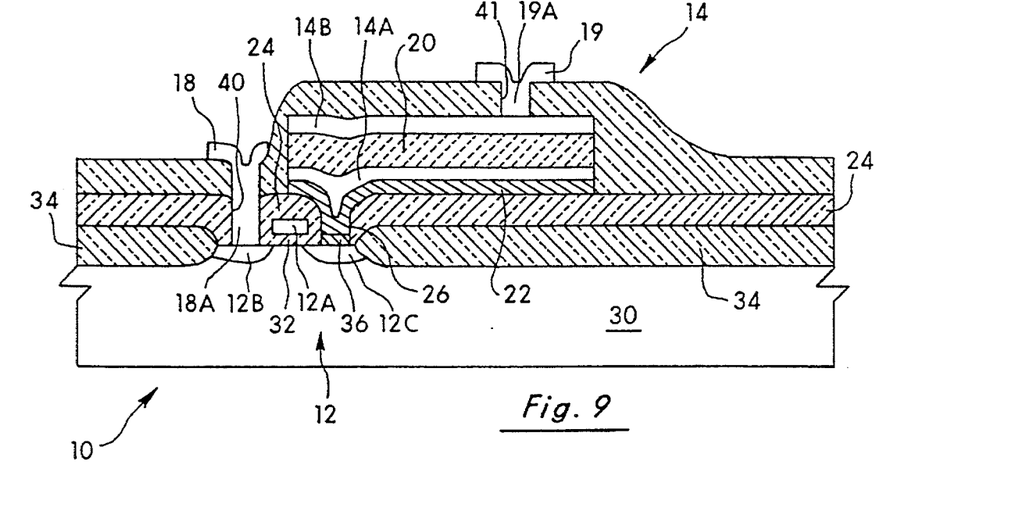
FIG. 9 is a cross-sectional view of the portion of the DRAM wafer of FIG. 8 following a photo-mask and etch step to pattern the bit line and top capacitor electrode contact holes and formation of the contacts in the holes.

The same circuit 10 in the form of a cross-sectional view of a single-cell portion of an integrated circuit DRAM chip according to the invention is shown in FIG. 9. It should be understood that the figures depicting the DRAMs are not meant to be actual cross-sectional views of any particular portion of an actual semiconducting device, but are merely idealized representations which are employed to more clearly and fully depict the structure and process of the invention than would otherwise be possible. In some instances, some materials that are well-know metals, semiconductors, or insulators, are not lined for the appropriate material—for example, the platinum electrodes 14A and 14B in FIG. 7 are not lined for metal—as the close juxtaposition of many layers of metal, insulator, semiconductor, and ceramic would be confusing if all layers were lined; the layers are much easier to distinguish if some are left blank. The transistor 12, capacitor 14, bit line 18 etc. and the other elements of FIG. 1 are indicated by the same numerals in FIG. 9. The word line 16 is generally considered to be the same element as gate 12A in the integrated circuit 10. Insulative layer 24 covers the transistor 12 and together with field oxide regions 34 overlies much of the substrate 30. A hole 26 penetrates the insulative layers 24 and 34 to the source drain/active area 12C. In place of the dielectric in the conventional capacitor, the ferroelectric capacitor 14 has a ferroelectric layer 20. In the preferred embodiment of the invention, a barrier layer 22 formed of a conductor such as titanium nitride (TiN), titanium tungsten (TiW), tantalum (Ta), titanium (Ti), tungsten (W), molybdenum (Mo) or chromium (Cr), a silicon-based material such as polysilicon, a silicide, or polycide, or a conductive oxide such as indium tin oxide (InSnO), tin dioxide ($SnO_2$), ruthenium oxide ($Ru_2O_3$) and others is formed between the bottom electrode 14A and the source/drain active area 12C and overlies insulative layer 24. As can be seen in FIG. 9, the ferroelectric capacitor 14 is oversize in that it overlays a significant portion of the cell 10. It also lies against the contact hole 26 which passes through the insulator 24 to the active area 12C. In order to make the term "oversize" definitive, we shall define it to mean that the total area it overlays the insulative layer 24 is about twice the area of source drain 12C or more. It is a feature of the invention that the ferroelectric capacitor 14 is almost identical to the conventional dielectric capacitor in a stacked capacitor DRAM in location and size, except that it does not have to be as large and convoluted as the conventional DRAM stacked capacitor because the ferroelectric capacitor is more efficient than the conventional capacitor. Thus the integrated circuit DRAM according to the invention can be as dense or denser than the conventional DRAM integrated circuit.

Detailed Description of the Integrated Circuit DRAM and Fabrication Process

Figure 2:
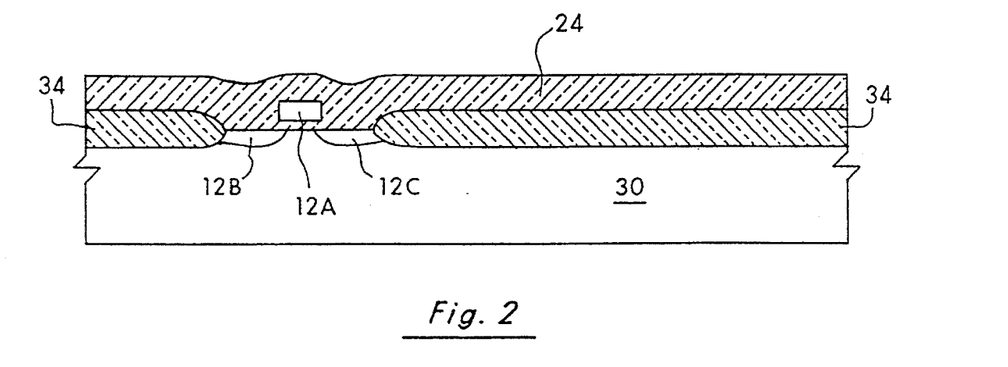
FIG. 2 shows a cross-sectional view of a portion of a partially fabricated DRAM integrated circuit according to the preferred embodiment of the invention comprising a silicon substrate, doped wells formed in the substrate, and field oxide regions, transistors, and an insulating oxide layer formed on the substrate.

Turning now to a more detailed description of the invention, FIG. 2 shows a cross-section of a preferred embodiment of a portion of an integrated circuit wafer 10 containing a single DRAM cell just prior to the steps that distinguish the invention. The wafer 10 preferably comprises a lightly doped p-type single crystal silicon substrate 30 which, in well-known processes, preferably a LOCOS (LOCalized Oxidation of Silicon) process, has been oxidized to form a thin gate insulating layer 32 and thick field oxide regions 34, and exposed to implantation processes to form active areas 12B and 12C of n-doping. A transistor gate conducting layer 12A, preferably made of doped polysilicon and often referred to as the word line in the DRAM structure, and an insulating protective layer 24 which preferably is made of silicon dioxide have been formed by well-know processes. The various parts just described may vary, for example the gate conducting layer 12A, or word line, may comprise several layers of different conductors, as is known in the art.

Figure 3:
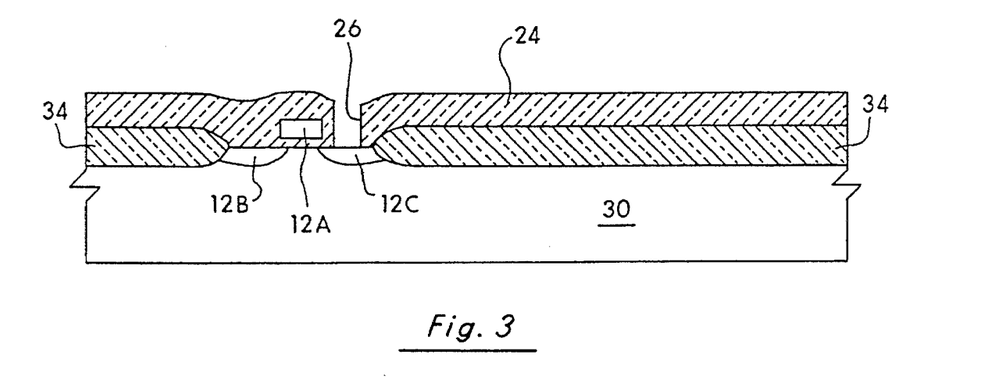
FIG. 3 is a cross-sectional view of the portion of the DRAM wafer of FIG. 2 following a photo-mask step and an oxide etch to open holes down to the active areas to which the future capacitor bottom electrode will be connected.
Figure 4:
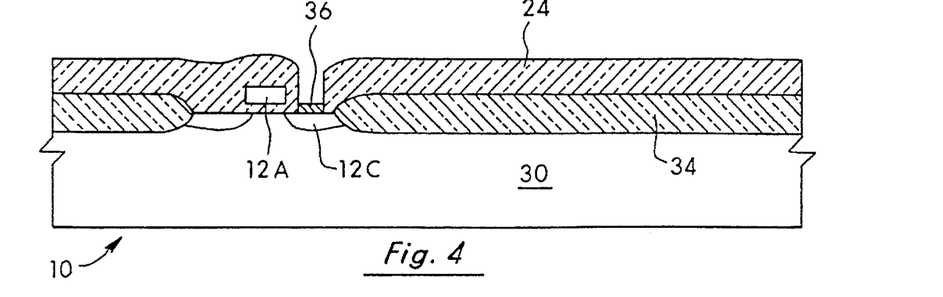
FIG. 4 is a cross-sectional view of the portion of the DRAM wafer of FIG. 3 following formation of a contact material over the active area.

Turning to FIG. 3, in the next step the contact hole 26 is formed to make an opening to the active area 12C to which the future capacitor bottom electrode will be connected; this hole 26 is opened by a standard process such as a photomask step followed by an RIE (Reactive Ion Etch) etching or wet etching, after which the photo resist is removed. In FIG. 4 a capacitor contact 36 has been formed in contact with the active area 12C. Contact 36 is preferably made of PtSi, MOSi, PbSi or other similar conducting material, may be mono- or multi-layered, and is preferably formed by a conventional self-aligned contact process. It is preferably formed using a silicide formation process such as sputtering or other metal deposition followed by high temperature sintering or other melting, or any other process that yields a good ohmic contact. As will be seen below, this contact formation step may be omitted in cases where the barrier layer 22 (FIG. 5) is deposited directly on the active area 12C.

Figure 5:
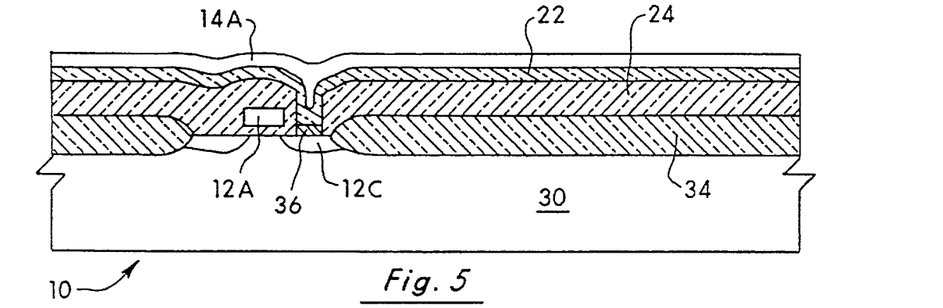
FIG. 5 shows a cross-sectional view of the portion of the DRAM wafer of FIG. 4 following formation of a barrier layer and a bottom electrode layer.

Turning to FIG. 5, a diffusion barrier layer 22 followed by a bottom electrode layer 14A are formed over the wafer 10. Diffusion barrier 22 prevents the interlayer diffusion of the elements comprising the contact 36 and the bottom electrode 14A. It is preferably formed of a metal such as titanium nitride (TiN), titanium tungsten (TiW), tantalum (Ta), titanium (Ti), tungsten (W), molybdenum (Mo) or chromium (Cr). The amount of high temperature oxygen annealing required in producing the ferroelectric layer 20 (FIG. 6) is determined by the selection of the material of the barrier layer 22, the material for ferroelectric layer 20, and the degree of crystallization desired, e.g. polycrystalline, partially crystalline, etc.). Since the diffusion barrier 22 materials are effected by high temperature, the selection of the diffusion material 22 strongly depends on the selection of the ferroelectric material 20 (FIG. 6) and the degree of crystallization desired for the ferroelectric material 20. For PZT as the ferroelectric material 20 and an annealing temperature of 550 to 650 degrees, TiN is a good selection as barrier 22 material. The quality of the diffusion barrier 22 strongly depends on the method and condition of deposition. Preferably RF and DC/magnetron sputtering or reactive sputtering are used. Generally, the higher RF or DC power that is used and the lower the pressure, the higher the density of the barrier material and the more effective the material is as a barrier to diffusion. However, too dense a barrier may cause strong internal tensile stresses, which may induce harmful physical changes to both the ferroelectric capacitor 14 and/or the MOS transistor 12. Thus a mid-range of density is preferable. In the preferred embodiment a Sibert™ type magnetron was used and a power in the range of 200 watts to 400 watts and a pressure ranging from 1 mTorr to 5 mTorr was found to produce an acceptable barrier. The bottom electrode 14A is preferably formed of platinum, preferably by DC magnetron sputtering RF sputtering. With or without a contact layer 36 present, the barrier layer 22 is essentially in physical contact with the source/drain active area 12C. "Essentially in physical contact" means that it is in actual physical contact or within an ohmic layer of being in contact, where the ohmic layer is a conducting material about 50 nm thick.

Figure 6:
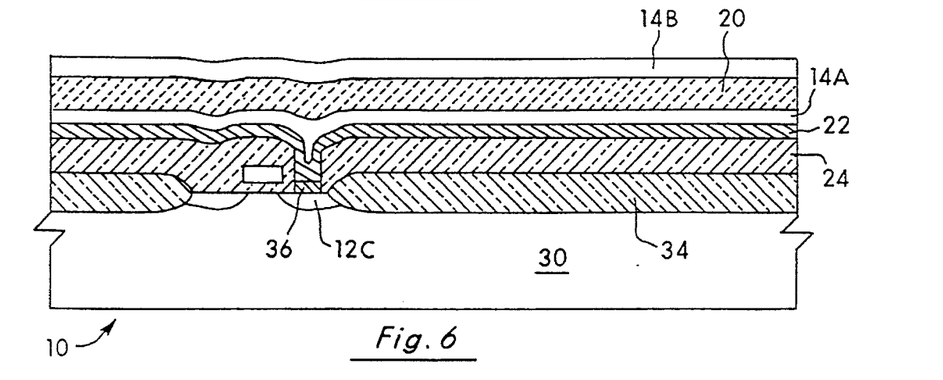
FIG. 6 shows a cross-sectional view of the portion of the DRAM wafer of FIG. 5 following formation of the ferroelectric cell layer followed by high temperature oxygen annealing and formation of the top electrode layer.

FIG. 6 shows the wafer 10 after formation of the ferroelectric cell layer 20 and the top electrode 14B. The ferroelectric layer 20 is preferably made of lead zirconate titanate (PZT) deposited on the bottom electrode 14A by Sol-Gel spin coating, or MOCVD (metal organic chemical vapor deposition). Sputtering may also be used, however the spin coating and MOCVD tend to fill in the holes, such as 26 better, and thus yield more planar coatings, which are preferable. After deposition of the ferroelectric thin film, the wafer is oxygen annealed at high temperature to obtain proper remanent polarization and other characteristics. The annealing temperature must be compatible with the materials chosen for the contact 36, the barrier layer 22, and the bottom electrode 14A. With the materials indicated above, an annealing temperature between 550 degrees C. and 650 degrees C. is preferable. The wafer may then be planarized by any of several known planarization methods, though generally it is not made perfectly flat. The top electrode 14B, preferably made of platinum, is then formed, preferably by DC magnetron sputtering or RF sputtering. Gold or silver or any conductive material that will resist oxidation may also be used as the top electrode. A single photo-mask and etch process, preferably using an RIE of ion-milling etc process, then patterns the ferroelectric capacitor 14 and barrier layer 22. In the embodiment shown in FIG. 7, the capacitor is shown to partially overlie the transistor 12 and extend over a substantial portion of the field oxide 34, which provides sufficient capacitance. Preferably, it overlies the gate 12A of transistor 12 by 10% to 50%. However, it may be larger or smaller depending on the application, the ferroelectric material used, etc. It may extend over as large an area as conventional stacked capacitors or be limited to a small area on either side of the hole 26. It is noted that in the region of the contact hole 26, the structure may make little or no contribution to the ferroelectric capacitance because the thickness of the ferromagnetic material 20 is greater than the other areas. However, this does not degrade the total ferroelectric capacitance severely, since in the structure disclosed there is more than adequate area for a ferroelectric capacitor. Further, since the portion in contact area 26 acts as a parallel capacitor, it provides some advantages, namely the elimination of leakage current and the reduction of the possibility of dielectric breakdown. The invention can also be implemented with many other ferroelectric materials other than PZT. For example, the ferroelectric materials described in U.S. patent application Ser. No. 807,439, which is hereby incorporated by reference, will also work well with the invention.

Figure 8:
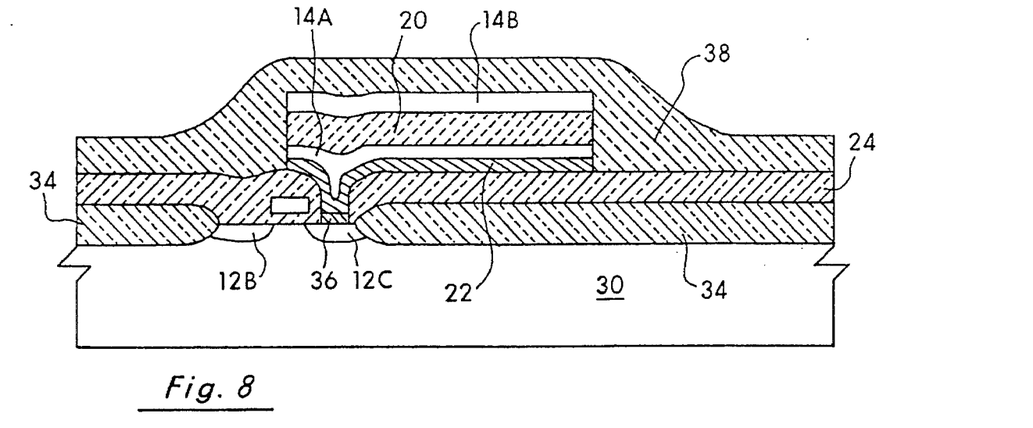
FIG. 8 is a cross-sectional view of the portion of the DRAM wafer of FIG. 7 following formation of a passivation layer.

Following the definition of the capacitor 14, a layer of insulator 38 is overlaid the entire wafer, as shown in FIG. 8, to provide passivation. Passivation layer 38 is preferably made of boro-phospho-silicate glass (BPSG) or other silicate glass, but may also be silicon dioxide or other suitable insulator such as $Si_3N_4$. Turning to FIG. 9, contact holes 40 and 41 are formed using a photo-mask and etch process, preferably an RIE or wet etch. Then bit line 18 and bit line contact 18A and plate 19 and capacitor top electrode contact 19A are formed. The bit line 18 and bit line contact 18A are shown formed as one piece, although they may also be formed in separate processes from separate materials. Likewise plate 19 and top electrode contact 19A are shown in as one piece, though they may be formed separately. Bit line 18, contact 18A, plate 19, and contact 19A may be made by any suitable metal used to make contacts in conventional DRAMs, such as tungsten, aluminum, or doped polysilicon, and may be formed by many different conventional processes.

Figure 10:
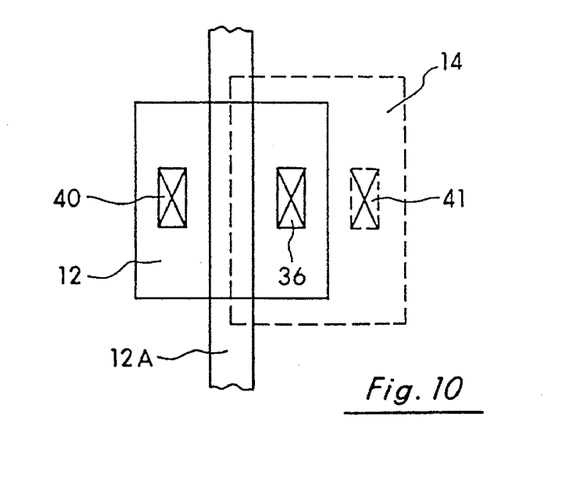
FIG. 10 shows an overhead layout of the portion of the DRAM of FIG. 9.

FIG. 10 is an overhead layout of the DRAM cell of FIG. 9 showing the areas occupied by the transistor 12, ferroelectric capacitor 14, the word line 12, the bit line contact 18A, the capacitor/transistor contact area 36, and the top electrode contact 19A.

Figure 11:
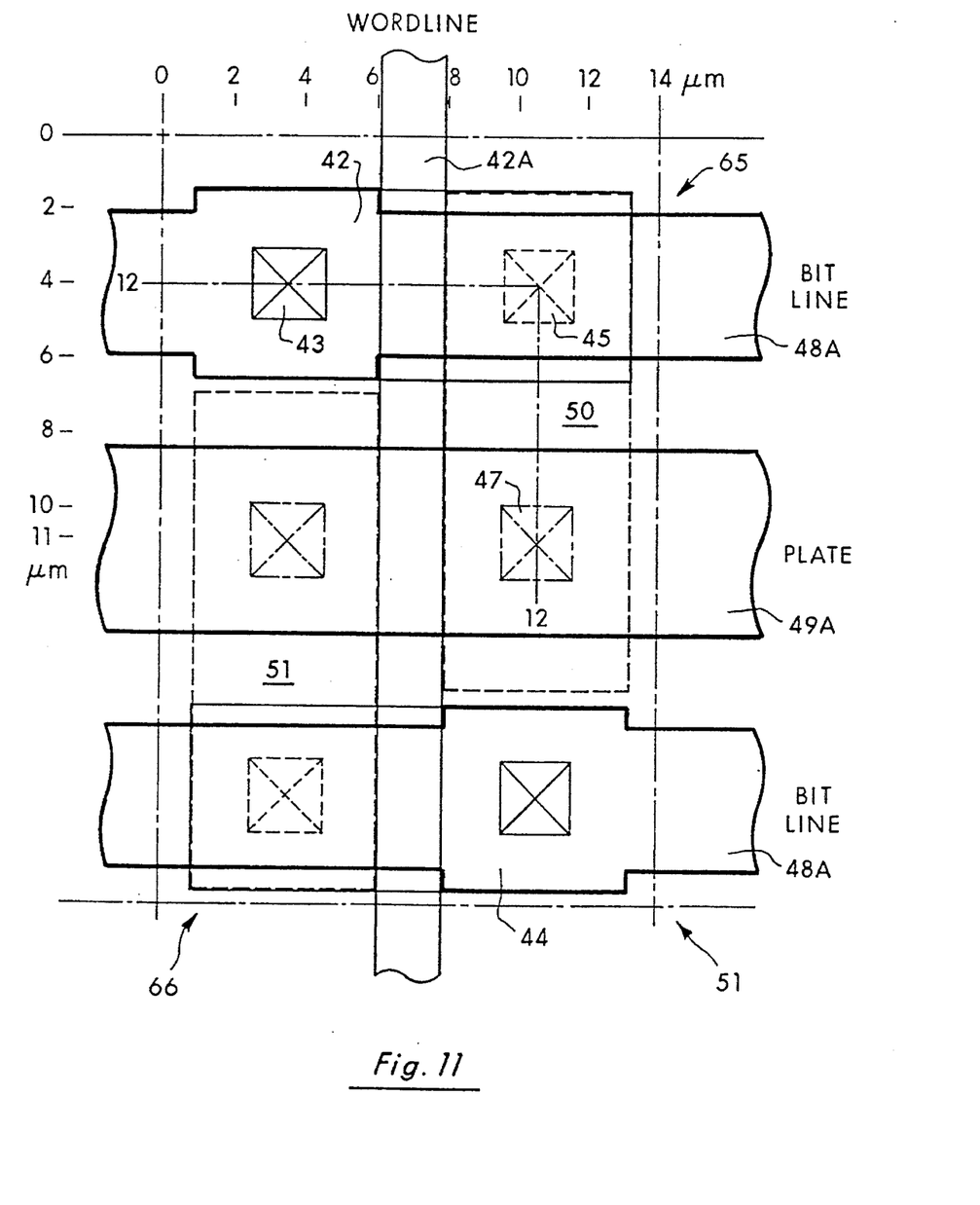
FIG. 11 is an overhead layout of an embodiment of the invention as it may be implemented in an actual DRAM showing a portion of the DRAM.
Figure 12:
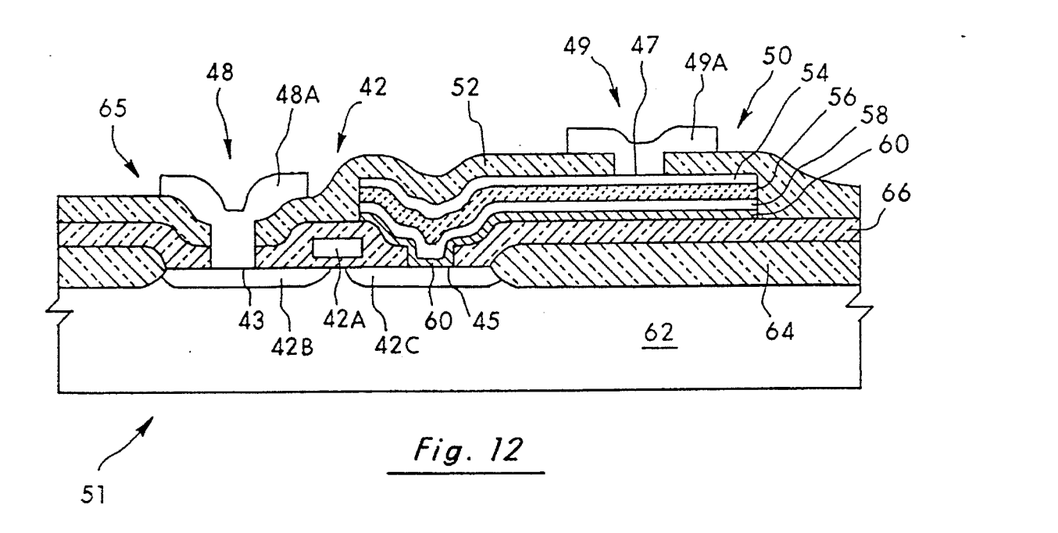
FIG. 12 is a cross-section of the DRAM portion of FIG. 11 taken through the line 12—12 in FIG. 11.
Figure 13:
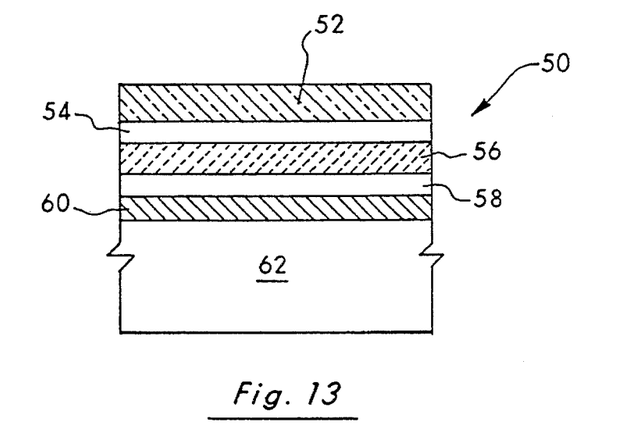
FIG. 13 is an enlarged cross-section of the ferroelectric capacitor of the embodiment of FIG. 11.

FIGS. 11, 12, and 13 illustrate an embodiment of the ferroelectric DRAM according to the invention as it may practically be implemented to form a compact cell structure. FIG. 11 is an overhead layout, FIG. 12 is a cross-section through line 12—12, of FIG. 11, while FIG. 13 is an enlarged cross-section of the ferroelectric capacitor 50.

Referring to FIG. 12, one cell 65 of the DRAM wafer 51 is shown. The cell 65 includes a transistor 42 and a capacitor 50. Transistor 42 comprises gate/word line 42A and source/drain active areas 42B and 42C. Bit line/contact 48 makes contact with active area 42B at 43. Capacitor 50 comprises top electrode 54, ferroelectric cell layer 56, and bottom electrode 58. A passivation layer 52 covers the capacitor 50 and other portions of the wafer 51 and is penetrated by the bit line/contact 48 and plate/contact 49. Plate/contact 49 contacts the capacitor top electrode at 47. A barrier layer 60 underlies the capacitor 50 and contacts the active area 42C at 45. The wafer 51 also includes the usual silicon substrate 62, field oxide regions 64, and insulating layer 66. No contact layer is inserted between the barrier layer 60 and the active area 42C in this embodiment, though one may be inserted to some choices of barrier layer 60 if they do not provide as good an ohmic contact as desired. Otherwise the materials and processes in this embodiment are as described in connection with the embodiment of FIGS. 2–10. Titanium tungsten (TiW) and titanium nitride (TiN) are the preferred barrier metals, although all the others previously mentioned may be used.

Referring to FIG. 11, a section of the DRAM wafer 51 comprising two cells 65, 66 is shown. In this FIG., the transistor areas are outlined with a solid line and the capacitor areas are outlined in with a dotted line. Both cells 65 and 66 are L-shaped. Cell 65 comprises transistor 42 and capacitor 50. Cell 66 comprises capacitor 51 and transistor 44. The capacitor 50 and transistor 42 overlap, as do the capacitor 51 and transistor 44. In this structure the two memory cells 65 and 66 are interwoven and share a common plate 49A which produces a dense array and reduces the size of the overall DRAM structure. In both FIGS. 11 and 12 a distance scale is given so that the approximate size of the various parts may be seen. It should be understood that the sizes are only approximate, and in some instances, particularly in the case of the layer thicknesses, such as the thickness of contact 61, the relative thicknesses are expanded or reduced in order facilitate depiction of all the features in the drawing.

Figure 14:
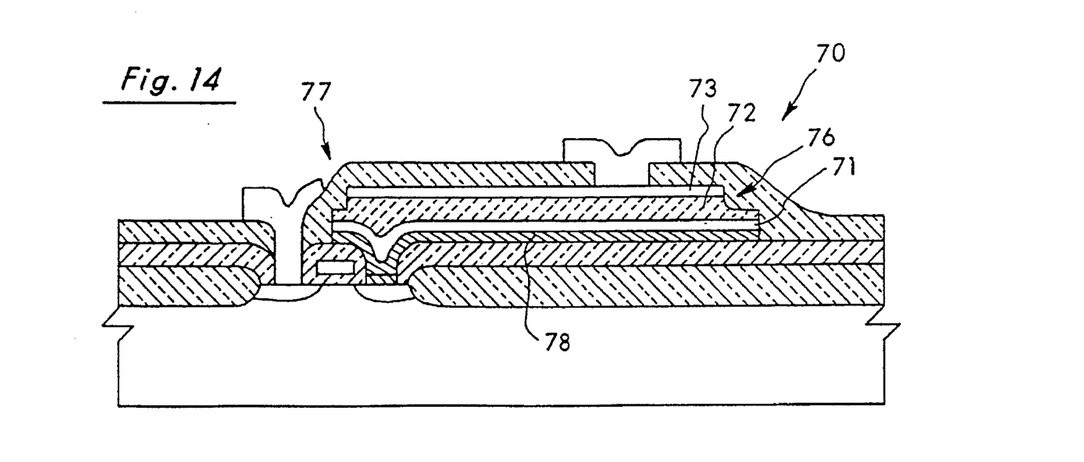
FIG. 14 is a cross-sectional view of an alternative embodiment of a DRAM according to the invention in which steps are formed at the end of the ferroelectric capacitor.

FIG. 14 shows an alternative embodiment of a DRAM according to the invention in which steps 76, 77 are formed at the ends of the ferroelectric capacitor 70. The capacitor 70 is formed as before to make a bottom electrode 71, a ferroelectric layer 72 and a top electrode 73. However the capacitor 70 is patterned in a two-mask process. A first mask defines the top electrode 73. Preferably an ion-milling etch process etches down halfway through the ferroelectric layer 72. Then a larger mask is used to define the lower half of the ferroelectric layer 72, the bottom electrode 71, and the barrier layer 78, followed by a second ion-milling etch to pattern the lower half of the capacitor 70 and barrier layer 78, and form the steps 76, 77. This embodiment adds a second photo-mask and etch process but lessens the chances of a short between the top electrode 73 and the bottom electrode 71 and therefore results in higher yields. All other aspects of the embodiment are as described in reference to the embodiments of FIGS. 2–10.

Figure 15:
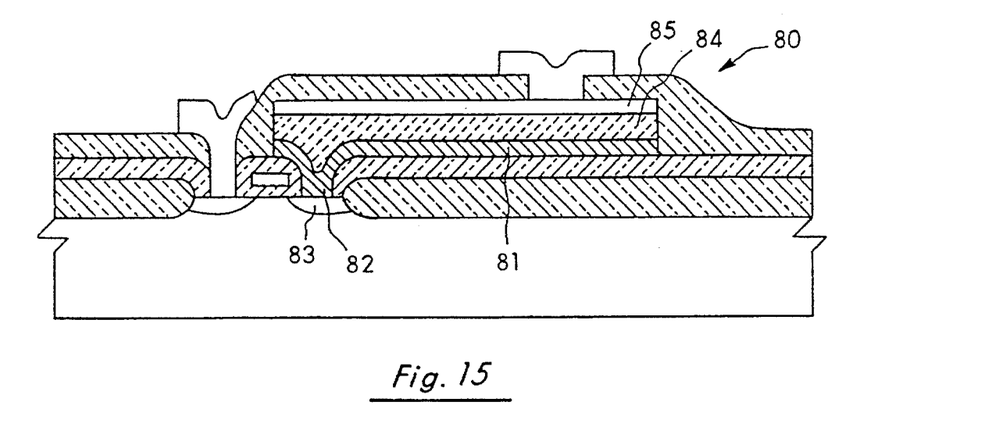
FIG. 15 is a cross-sectional view of an alternative embodiment of a DRAM according to the invention in which the barrier layer is utilized as the bottom electrode of the ferroelectric capacitor.

FIG. 15 shows a further alternative embodiment of a DRAM according to the invention in which the barrier layer is utilized as the bottom electrode 81 of the ferroelectric capacitor 80. In this embodiment the barrier layer 81 is directly deposited on the contact region 82 of the active area 83, and the ferroelectric layer 84 is directly deposited on the barrier layer 81. The barrier material 81 should be selected based on two considerations: 1) the barrier layer 81 should protect against interdiffusion of ions between the contact region 82 and the ferroelectric material; and 2) the formation energy of the barrier metal-oxide should be less that the formation energy of the metal-oxides of the components of the ferroelectric material. Titanium nitride (TiN), tungsten (W), and titanium tungsten (TiW) fulfill these conditions and make suitable barrier materials for this embodiment. The top electrode 85 and all other aspects of this embodiment are the same as for the embodiments of FIGS. 11–13. An ohmic contact may be used if desired. In this embodiment as in the others, with or without a contact layer present, the bottom electrode 81 is essentially in physical contact with the source/drain active area 83. As indicated above, "essentially in physical contact means that it is in actual physical contact or within an ohmic layer of about 50 nm thick of being in actual physical contact.

Figure 16:
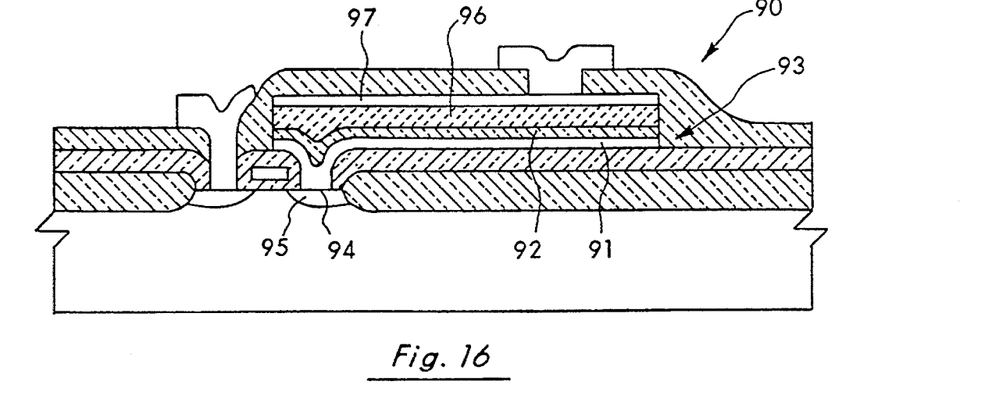
FIG. 16 is a cross-sectional view of an alternative embodiment of a DRAM according to the invention in which a silicon-based material forms the bottom electrode of the ferroelectric capacitor.

FIG. 16 is another alternative embodiment of a DRAM according to the invention in which a silicon-based material 91, optionally having a thin oxide coating 92, forms the bottom electrode 93 of the ferroelectric capacitor 90. In this embodiment a layer of conductive silicon-based material 91 is formed in contact with the contact area 94 of active area 95. The material 91 is preferably polysilicon, a silicide, preferably a metal silicide, or polycide. The ferroelectric layer 96 is formed directly on the silicon-based layer 91 by known processes. During oxygen annealing, an oxide coating 92 may form between the silicon-based layer 91 and the ferroelectric layer 96 to complete the bottom electrode 93. The oxide coating 92 should be 5 nm or less, otherwise a parasitic capacitor may be formed that would divide the voltage applied to the lower electrode 93 and degrade performance. Other materials and processes in this embodiment are as discussed in relation to FIGS. 11–13.

Figure 17:
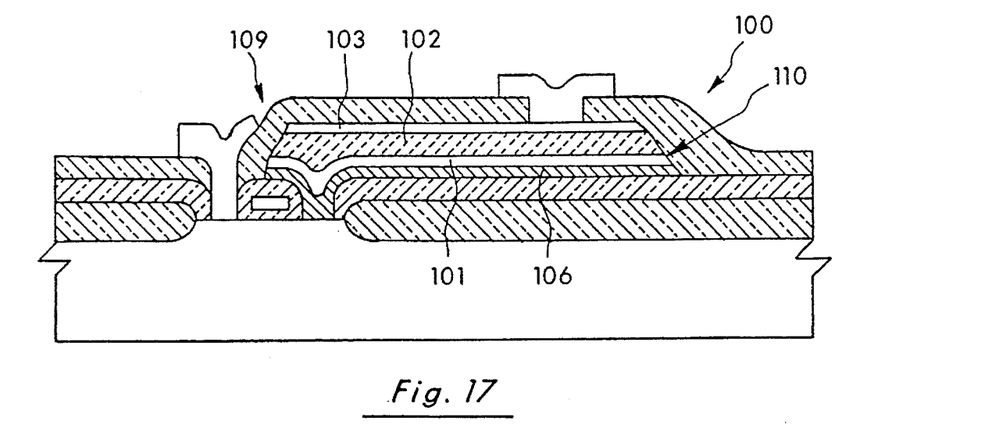
FIG. 17 is a cross-sectional view of an alternative embodiment of a DRAM according to the invention in which the ends of the ferroelectric capacitor are tapered.

A further alternative embodiment of a DRAM according to the invention is shown in FIG. 17. In this embodiment, the ends 109 and 110 of the ferroelectric capacitor 100 are tapered. This embodiment is fabricated in the same manner as the embodiments of FIG. 14 with barrier layer 106, bottom electrode 101, ferroelectric layer 102, and top electrode 103 formed in subsequent depositions, with an oxygen annealing following the ferroelectric layer 102 deposition. However, in this embodiment, the ends 109 and 110 of the ferroelectric capacitor 100 a tapered, preferably by an ion milling process with the wafer inclined against the ion beam, or using ion implantation to etch the rim of the capacitor, or any other suitable process such as isotropic etching. Preferably the taper makes an angle of from 30 degrees to 70 degrees with the vertical. As with the embodiment of FIG. 14, the taper decreases the possibility of a short developing between the bottom electrode 101 and top electrode 103 of capacitor 100, thereby increasing yields.

Figure 18:
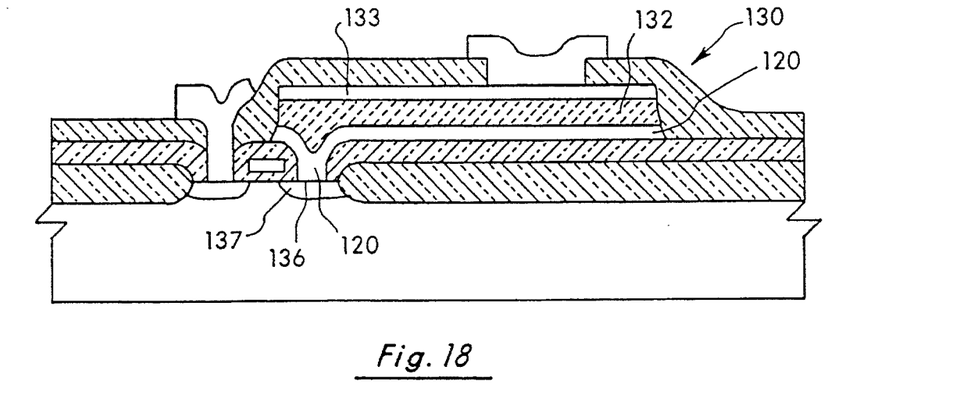
FIG. 18 is a cross-sectional view of an alternative embodiment of a DRAM according to the invention in which a conductive oxide forms the bottom electrode of the ferroelectric capacitor.

In FIG. 18 a further alternative embodiment of a DRAM according to the invention is shown in which a conductive oxide is used to form the bottom electrode 120 of the ferroelectric capacitor 130. The details of this embodiment are the same as the embodiment of FIG. 15 except for the following. In this case a bottom electrode 120 made of a conductive oxide, such as indium tin oxide (InSnO), tin dioxide ($SnO_2$), ruthenium oxide ($Ru_2O_3$) and others, is applied directly to the contact region 136 of the active area 137. This conductive oxide layer 120 may be made by either of the following methods: 1) the deposition of a metal, such as tin, ruthenium, etc., followed by heating to a high temperature in the presence of pressurized oxygen to form the metal-oxide; Preferably a temperature range of from 500 degrees C. and 600 degrees C. is used with an oxygen pressure of from 1 atmosphere to 2 atmospheres; or 2) the sputtering of the conductive oxide directly. It is believed that the oxygen ions in the conductive oxide compensate for an oxygen deficiency region at the ferroelectric interface such that the Fermi-level of the bottom electrode remains inside the interface layer. This results in the charge compensation occurring almost entirely outside of the electrode.

Figure 19:
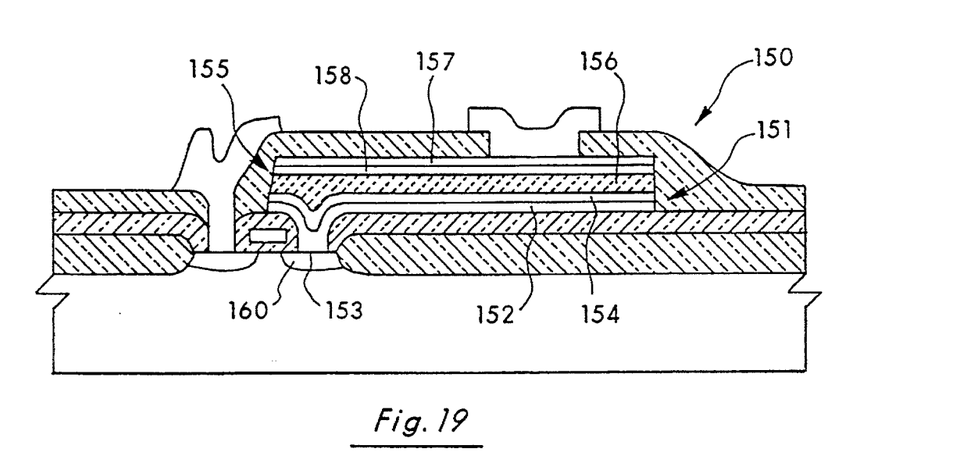
FIG. 19 is a cross-sectional view of an embodiment of the invention in which both the top and bottom electrodes are composed of a silicon-based material having a thin oxide coating.

FIG. 19 is an embodiment of the invention in which both the bottom electrode 151 and the top electrode 155 of ferroelectric capacitor 150 are made of a silicon-based material 152, optionally having a thin oxide coating 154. In this embodiment a layer of conductive silicon-based material 152 is formed in contact with the contact area 153 of active area 160. The material 152 is preferably polysilicon, a silicide, preferably a metal silicide, or polycide. The ferroelectric layer 156 is formed directly on the silicon-based layer 152. During oxygen annealing, an oxide coating 154 may form between the silicon-based layer 152 and the ferroelectric layer 156 to complete the bottom electrode 151. The top electrode 155 may be formed before or after oxygen annealing, preferably afterwards. The layer 157 is also a silicon-based material, preferably polysilicon, a silicide, preferably a metal silicide, or polycide. Again an oxide coating 158 may form during the annealing process. The oxide coatings 154, 158 should be 5 nm or less thick, otherwise a parasitic capacitor may be formed that would divide the voltage applied to the capacitor 150 and degrade performance. Other materials and processes in this embodiment are as discussed in relation to FIGS. 11–13.

Figure 20:
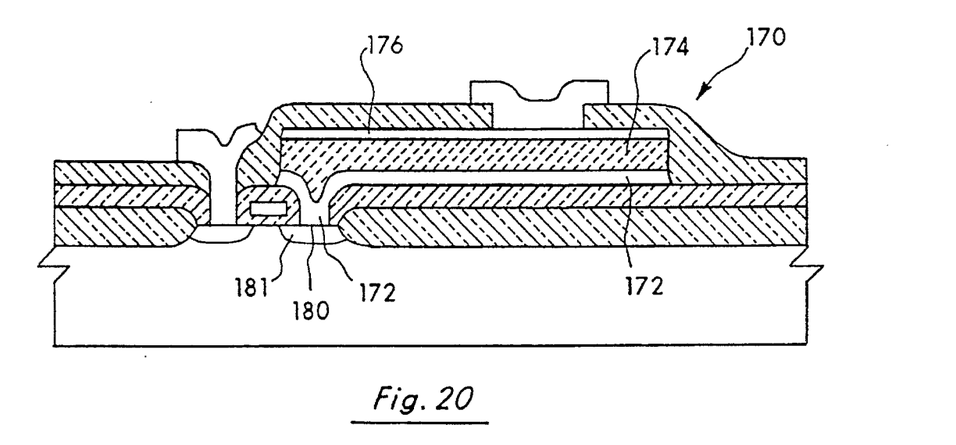
FIG. 20 is a cross-sectional view of an embodiment of the invention in which the top and bottom electrodes are made of either the silicon-based material without the conductive coating or the conductive oxide material.

FIG. 20 shows an embodiment in which the bottom electrode 172 and top electrode 176 are made of either a polysilicon, a silicide, preferably a metal silicide, or polycide, without an oxide layer, or of conductive oxide. The details of this embodiment are the same as the embodiment of FIG. 15 except for the following. In the case of electrodes 172, 176 made of a silicon-based material, the capacitor is formed as described in the embodiment of FIG. 19 with the annealing temperature and time sufficiently small that the oxide layer does not form. In the case of electrodes 172, 176 made of a conductive oxide, such as indium tin oxide (InSnO), tin dioxide ($SnO_2$), ruthenium oxide ($Ru_2O_3$) and others, the electrodes 172, 176 may be made by either of the following methods: 1) the deposition of a metal, such as tin, ruthenium, etc., followed by heating to a high temperature in the presence of pressurized oxygen to form the metal-oxide; Preferably a temperature range of from 500 degrees C. to 600 degrees C. is used with an oxygen pressure of from 1 atmosphere to 2 atmospheres; or 2) the sputtering of the conductive oxide directly. It is believed that the oxygen ions in the conductive oxide compensate for an oxygen deficiency region at the ferroelectric interface such that the Fermi-level of the bottom electrode remains inside the interface layer. This results in the charge compensation occurring almost entirely outside of the electrode. With each of the above materials in this embodiment and in all of the above processes in this embodiment, the material is preferably applied directly to the contact region 180 of the active area 181, although as in other cases an additional material to improve the ohmicity of the contact may be used.

The particular dimensions of the various layers and parts described above can vary widely depending on a wide variety of factors. The nominal size in the preferred embodiment, particularly with respect to the two dimensions in the plane of the paper in FIG. 11, can be seen by the scales in FIGS. 11 and 12. Typical thicknesses, that is the dimensions in the vertical direction in FIG. 12, are as follows: the thickness of the field oxide is preferably from 500 nm to 1500 nm; the thickness of the insulative layer 66 is preferably about 800 nm; the thickness of ohmic contact 36 is about 50 nm; the thickness of the barrier layer 60, the bottom electrode 58, the ferroelectric layer 56, and the top electrode 54 are preferably about 150 nm, 150 nm, 300 nm, and 150 nm, respectively. The thickness of the passivation layer 52 is preferably about 1000 nm. The thickness of the bit line 48A and plate 49A are preferably about 800 nm. The thicknesses of the corresponding layers in the other embodiments are similar. All these dimensions are dependent on the applications, specifications desired, etc. and may vary from between about one-half to about twice the preferred thicknesses given. The other relevant dimensions all depend on the above dimensions, or are conventional.

The invention can be employed in integrated circuits that utilize the ferroelectric layers 20, 56, 72, 84, 96, 102, 132, 156, and 174 as either a high dielectric constant, non-switching material for volatile memories and also in integrated circuits that utilize the ferroelectric material as switching material for non-volatile memories.

A feature of the invention is that oversized ferroelectric capacitors 14, 50, 70, 80, 90, 100, 130, 150, and 170 are located against contact holes, such as 26. This is made possible in the embodiments shown by the discovery or recognition that good ferroelectric capacitors can be formed over the insulators 24, 66, etc. that cover the transistors 12, 42, etc. This eliminates the complex barrier and isolation layers of the prior art and allows the capacitors to be located in the same area as they are located in conventional non-ferroelectric integrated circuits. It also minimizes the problem of poor ferroelectric properties that characterized prior art ferroelectric capacitors that were located entirely in the contact holes.

Another feature of the invention is the simple, one-mask (or two-mask when stepped capacitor edges are desired) process for making the ferroelectric capacitors.

A further feature of the invention is the use of a single, relatively thin barrier layer in each of the embodiments. In some embodiments the barrier layer acts as the bottom electrode.

A further feature of invention is the use of a variety of novel materials and processes to create the single relatively thin barrier layer/bottom electrode.

Still another feature of the invention is that the barrier layer materials and processes are all compatible with the common materials and processes used in non-ferroelectric integrated circuits, and in many cases are the same as materials and processes used in non-ferroelectric integrated circuits.

Yet another feature of the invention is that, in general, the materials that may be used as the barrier layer also may be used as the top and bottom electrodes of a ferroelectric capacitor. This greatly expands the number of materials that may be used to make ferroelectric capacitors.

There has been described a novel, simplified integrated circuit fabrication process and structure which can be utilized to build more compact and better performing integrated circuit memories and which has many other advantages. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that it is seen to be possible to fabricate an oversize ferroelectric capacitor with good ferroelectric properties against contact holes, similar structures may be fabricated in integrated circuits in addition to DRAMs. Further, now that it is seen possible to make ferroelectric devices with good ferroelectric properties over insulators with just a single, relatively thin barrier material separating the ferroelectric device and the insulator, the same principles can be applied to other integrated circuit structures. It is also evident that the steps recited may in some instances be performed in a different order. Or equivalent structures and process may be substituted for the various structures and processes described. Or a variety of different dimensions and materials may be used. Additional structures and process steps may be added. Consequently, the invention is to be construed as embracing each and every novel feature and novel combination of features present in and/or possessed by the ferroelectric integrated circuit structures and fabrication processes described.

What is claimed is:

1. A method of fabricating an integrated circuit comprising:

providing a semiconducting wafer including a semiconducting substrate;

forming a bottom capacitor electrode, a ferroelectric layer, and a top capacitor electrode without intervening photo-mask steps;

patterning said ferroelectric capacitor circuit to provide an edge having an outer bottom capacitor electrode portion, an outer ferroelectric layer portion, and a top capacitor electrode portion, said bottom capacitor electrode portion extending outwardly beyond said top capacitor electrode portion for a sufficient distance to place said bottom electrode portion within an angle drawn from a point on said top capacitor electrode portion, said angle ranging from 30° to 70° relative to a perpendicular line taken from one of said electrodes.

2. A method of fabricating an integrated circuit as in claim 1 wherein said step of patterning comprises the steps of:

patterning said top capacitor electrode in a first photo mask step using a first photo-mask to provide said outer top capacitor electrode portion; and patterning at least a portion of said ferroelectric layer and said bottom capacitor electrode in a second photo-mask step using a second photo-mask having a larger area than said first photo-mask to provide said outer ferroelectric layer portion and said outer bottom capacitor electrode portion.

3. A method as in claim 1 wherein said step of patterning includes a step of creating a gradual taper from said top electrode across said ferroelectric layer to said electrode.

4. A method as in claim 1 wherein said patterning step includes a step of inclining the substrate at said angle relative to an ion-etching beam to provide a uniform taper across said outer bottom capacitor electrode portion, said outer ferroelectric layer portion, and said top capacitor electrode portion.

5. The method as set forth in claim 1, further including a step of depositing a barrier layer over said bottom capacitor electrode, wherein said barrier layer comprises a material from the group consisting of titanium nitride, titanium tungsten, tantalum, titanium, tungsten, molybdenum, chromium, indium tin oxide, tin dioxide, and ruthenium oxide.

6. The method as set forth in claim 5, further including steps of manufacturing a transistor on said substrate proximal to said ferroelectric capacitor and connecting said transistor with said ferroelectric capacitor to form a memory cell.

* * * * *